United States Patent [19]
Mihara et al.

[11] Patent Number: 5,406,510
[45] Date of Patent: Apr. 11, 1995

[54] NON-VOLATILE MEMORY

[75] Inventors: Takashi Mihara, Saitama, Japan; Carlos A. Paz De Araujo; Larry D. McMillan, both of Colorado Springs, Colo.

[73] Assignees: Symetrix Corporation, Colorado Springs, Colo.; Olympus Optical Co., Ltd., Tokyo, Japan

[21] Appl. No.: 92,233

[22] Filed: Jul. 15, 1993

[51] Int. Cl.[6] .................... H03K 19/173; G11C 11/22
[52] U.S. Cl. .................... 365/145; 365/149; 365/189.09; 365/189.05; 365/65
[58] Field of Search ............ 365/185, 145, 149, 65, 365/189.05, 189.09

[56] References Cited

U.S. PATENT DOCUMENTS

| | | | |
|---|---|---|---|
| 4,128,773 | 12/1978 | Troutman et al. | 307/238 |
| 4,809,225 | 2/1989 | Dimmler et al. | 365/149 |
| 4,853,893 | 8/1989 | Eaton, Jr. | 365/145 |
| 4,873,664 | 10/1989 | Eaton, Jr. | 365/145 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 5,010,518 | 4/1991 | Toda | 365/145 |
| 5,029,128 | 7/1991 | Toda | 365/145 |
| 5,038,323 | 8/1991 | Schwee | 365/145 |
| 5,086,412 | 2/1992 | Jaffe et al. | 365/65 |
| 5,198,706 | 3/1993 | Papaliolios | 365/149 |

*Primary Examiner*—Viet Q. Nguyen
*Attorney, Agent, or Firm*—Duft, Graziano & Forest

[57] ABSTRACT

A non-volatile memory includes a constant voltage source, a bit line, a memory cell having a first ferroelectric capacitor connected between the bit line and the constant voltage source, a source of a reference voltage, and a latch connected between the bit line and the reference voltage. The latch drives the bit line to the same logic state as the ferroelectric capacitor to read and rewrite the capacitor in a single operation. The reference voltage is provided by a ferroelectric dummy capacitor having an area smaller than the area of the first capacitor but greater than ½ the area of the first capacitor.

19 Claims, 9 Drawing Sheets

NON-VOLATILE MEMORY

BACKGROUND OF THE INVENTION

FIELD OF THE INVENTION

The invention in general relates to non-volatile electronic memories and more particularly to an apparatus and method for reading and restoring a ferroelectric capacitor in a memory cell.

STATEMENT OF THE PROBLEM

It is well-known that ferroelectric materials are capable of retaining a polarization which can be used to store information in a non-volatile memory. For example, if a strong enough electric field is placed across a ferroelectric capacitor, when the electric field is removed, a polarization in the direction of the field remains. If the field is placed across the same capacitor in the opposite direction, when the field is removed, a polarization in the opposite direction remains. Electronic circuits have been designed to associate the polarization in one direction with a digital logic "1" state, and polarization in the opposite direction with a logic "0" state. Up to now however, these circuits have been relatively complex. Some circuits such as those described in U.S. Pat. No. 4,873,664, U.S. Pat. No. 4,853,893, U.S. Pat. No. 4,914,627 and U.S. Pat. No. 4,910,708, all issued to S. Sheffield Eaton, Jr., U.S. Pat. No. 893,272 issued to S. Sheffield Eaton, Jr. et. al. and U.S. Pat. No. 4,888,733 issued to Kenneth J. Mobley utilize well-known simple sense amplifiers and memory array structures used in conventional non-ferroelectric, volatile DRAMs. These well-known conventional DRAM structures include memory cells arranged in rows and columns, each memory cell including at least one transistor having a gate and a pair of source/drains, a capacitor having a pair of plate electrodes, and the memory also including plate lines connected to one plate of the capacitor in each cell, bit lines connected to the other plate of the capacitor through the transistor, and word lines connected to the control gate of the transistor. The transistor acts as a switch controlled by its gate, to connect the capacitor to the bit line. However, to adapt the conventional DRAM circuitry to the ferroelectric materials, the circuits described in these references all require complex pulsing circuits requiring large amounts space on an integrated circuit chip and utilizing large amounts of energy, and/or require complex cell structures that also utilize large amounts of integrated circuit space, all of which also increases the time it takes to perform memory operations. As a result, no ferroelectric memories that have been commercially successful have yet been made.

One solution to the complexity problem is described in U.S. Pat. No. 5,038,323 issued to Leonard J. Schwee. This patent describes a non-volatile ferroelectric memory in which all the capacitors are connected to a single plate line having a constant voltage of approximately ½ the supply voltage, that is, ½ the high voltage associated with a logic "1" in the memory. As is conventional in DRAMs, the bit lines are connected to a sense amplifier. However, the Schwee patent does not describe the circuitry of the sense amplifier, and indicates that the output of the sense amplifier is connected to the bit line only at the end of the read cycle. This suggests a complex logic circuitry to determine when the read cycle is sufficiently complete to connect the sense amplifier output to it. Further a flow chart associated with the sense process suggests that the sense amplifier circuitry is complex. In addition, the disclosure does not recognize that because of the low state of the bit line prior to read, the ferroelectric capacitor will dump charge on the bit line when it is in the logic "0" state as well as when it is in the logic "1" state.

Schwee requires that additional electronic operations must take place between the read cycle, when a logic signal is output to a data readout terminal, and the restore cycle when a signal voltage is applied to the ferroelectric capacitor to restore it. Specifically, a logic gate connects the output of the sense amplifier to the bit line to restore the polarization state of the ferroelectric capacitor. Since the logic gate is controlled by a logic control system, numerous electronic logic operations must occur between the read and restore operations. In other ferroelectric memories, separate electronic signals, are used to go from the read operation to the restore operation. For example, in U.S. Pat. No. 4,873,664 referred to above, the plate line is dropped low after the read operation in order to restore the ferroelectric capacitor. Since each logic operation and electronic signal requires that at least one electronic line or device change its state, this significantly slows the read and restore operation. Thus ferroelectric memories have not been able to compete with conventional memories in terms of speed of operation.

SOLUTION TO THE PROBLEM

The present invention solves the above problem by, like the Schwee reference, providing a memory circuit that ties all the memory capacitors to a substantially constant voltage source. Preferably the constant voltage is ½ the supply voltage. However, unlike the Schwee reference, the circuit is designed so a simple sense amplifier, by itself, both reads the polarization state of the ferroelectric material and restores it to it original polarization state. The sense amplifier output is connected to the bit line throughout the read cycle.

Preferably, the above problem is solved utilizing a non-volatile memory of the type having a constant voltage source, a bit line, a memory cell comprising a first ferroelectric capacitor capable of taking on a first polarization state corresponding to a logic "1" state and a second polarization state corresponding to a logic "0" state, and a sense amplifier for sensing and amplifying the signal placed on the bit line by the capacitor when the state of the capacitor is read, the ferroelectric capacitor connected between the bit line and the constant voltage source, wherein the memory further comprises a source of a reference voltage, and the sense amplifier comprises a latch connected between the reference voltage source and the bit line.

Preferably the polarization switching charge is much greater than the charge due to the capacitance of the ferroelectric capacitor.

The reference voltage may be provided by a second constant voltage source. Alternatively, the reference voltage is provided by a dummy ferroelectric capacitor circuit. Preferably, the dummy ferroelectric capacitor has an area that is smaller than the area of the operating capacitor but greater than ½ the area of the operating capacitor. In another embodiment, the reference voltage is provided by a linear capacitor circuit.

The simple read and restore circuit of the invention may also be used with nonvolatile, ferroelectric memory cells other than the 1T, 1C cell. As an example, an application to a 2T, 2C cell is provided.

In another aspect the problem is solved utilizing a non-volatile memory of the type having a constant voltage source, a bit line, a reference voltage line connected to a source of a reference voltage, and a memory cell comprising a first ferroelectric capacitor capable of taking on a first polarization state corresponding to a logic "1" state and a second polarization state corresponding to a logic "0" state, with the first ferroelectric capacitor connected between the bit line and the constant voltage source, the memory including sense amplifier means connected to the bit line and to the reference line for driving the bit line and the reference line to different voltages corresponding to opposite logic states.

The performance of the simple combination sense amplifier/restore circuit according to the invention is excellent. Memories with capacitors as small as 2.6 $\mu m \times 2.6$ $\mu m$ can be read and restored utilizing the circuit. Numerous other features, objects and advantages of the invention will become apparent from the following description when read in conjunction with the accompanying drawings.

DESCRIPTION OF THE PREFERRED EMBODIMENT

1. Overview.

Figure 1:
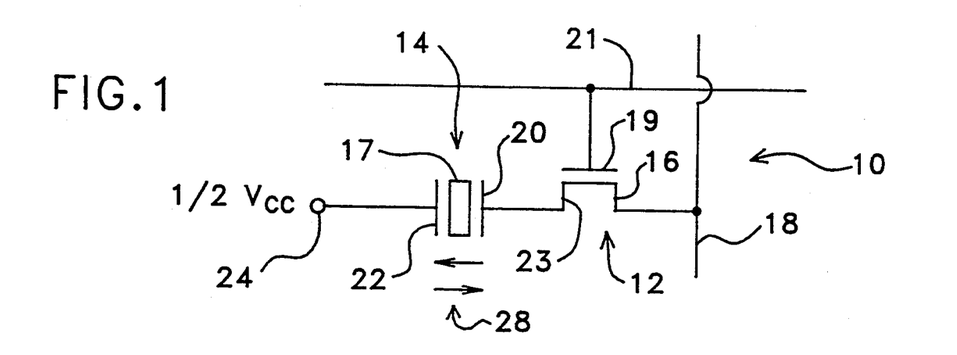
FIG. 1 is a circuit diagram for a 1T, 1C memory cell according to the preferred embodiment of the invention.

Directing attention to FIGS. 1 through 4, several exemplary embodiments of memory cells that may be incorporated into the memory according to the invention are shown. FIG. 1 shows a 1T, 1C (one transistor, one capacitor) cell 10 including transistor 12 and ferroelectric capacitor 14. As in the conventional DRAM 1T, 1C memory cell, one of the source/drains 16 of transistor 12 is connected to a bit line 18, the other source/drain 23 of transistor 12 is connected to one electrode 20, generally called a plate 20, of capacitor 14, and the gate 19 of transistor 12 is connected to the word line 21. The transistor acts as a switch to connect and disconnect capacitor 14 from bit line 18 and is controlled by the signal on word line 21, which carries the signal that selects the row of memory cells to be accessed. The bit line 18 carries the information signal to and from the cell 10. According to the invention, the other electrode plate 22 of capacitor 14 is connected to a constant voltage source 24, which is preferably approximately $\frac{1}{2}$ the supply voltage, which supply voltage is indicated as Vcc herein. Voltage source 24 may be a line, called a plate line, but is shown as a single source terminal to emphasize the fact that in the memories according to the invention there is a single "plate line" which carries a single constant voltage, in contrast to conventional ferroelectric memories in which a plurality of plate lines carry a varying voltage pulse.

Figure 2:
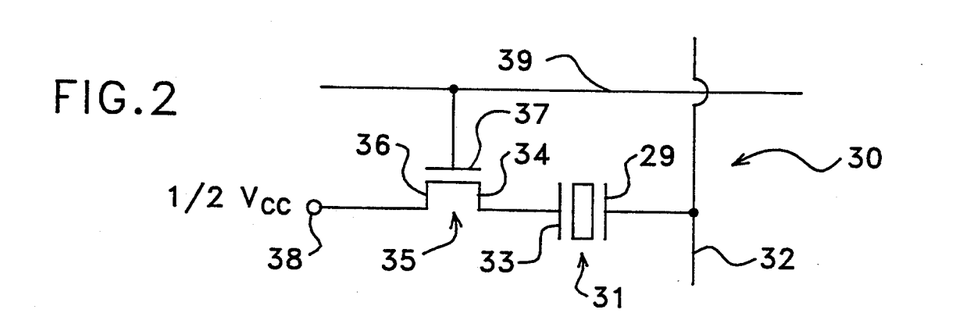
FIG. 2 is a circuit diagram for an alternative 1 T, 1C memory cell according to the invention.

FIG. 2 shows another embodiment of a 1T, 1C memory cell 30 according to the invention. In this embodiment, one plate 29 of ferroelectric capacitor 31 is connected directly to the bit line 32, and the other plate 33 of capacitor 31 is connected to one source/drain 34 of transistor 35; the other source/drain 36 of transistor 35 is connected to constant voltage source 38. Gate 39 of transistor 35 is connected to word line 39.

Figure 3:
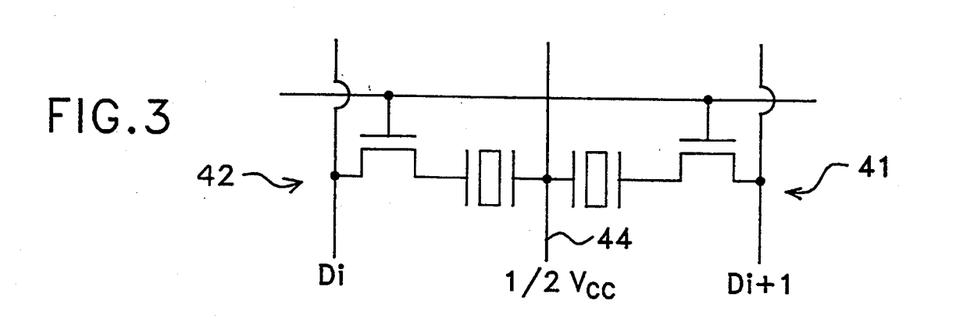
FIG. 3 is a circuit diagram for an alternative arrangement of the 1T, 1C memory cell according to the invention.

FIG. 3 shows two 1T, 1C memory cells 41 and 42 of the type shown in FIG. 1. Both cells 41 and 42 are connected to a common plate line 44 which carries a constant voltage, preferably $\frac{1}{2}$ Vcc. Many other architectures in which groups of cells share the same plate line may be utilized in memories according to the invention.

Figure 4:
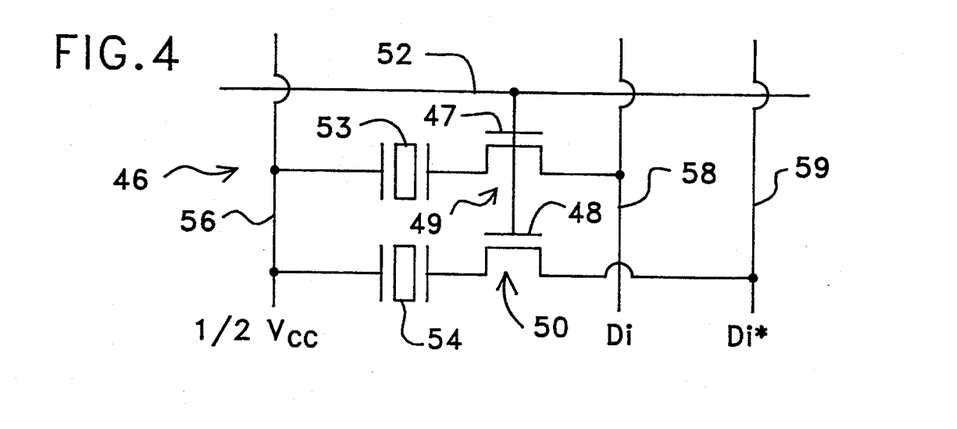
FIG. 4 is a circuit diagram for a 2T, 2C memory cell according to the invention.

FIG. 4 shows a 2T, 2C (two transistor, 2 capacitor) memory cell 46. The gates 47, 48 of both transistors 49, 50 in the cell are connected to the same word line. Bit line 58 is connected to transistor 49 and carries a signal Di. Bit line 59 is connected to transistor 50 and carries the signal Di*, the inverse signal to Di. In the discussion herein, a "*" indicates the inverse of a signal. Ferroelectric capacitors 53 and 54 are connected to the same plate line 58, which carries a constant voltage, again preferably $\frac{1}{2}$ Vcc.

As will be seen in more detail below, any of the memory cells shown in FIGS. 1 through 4, as well as other memory cells may be utilized in the non-volatile, ferroelectric memories according to the invention.

Figure 5:
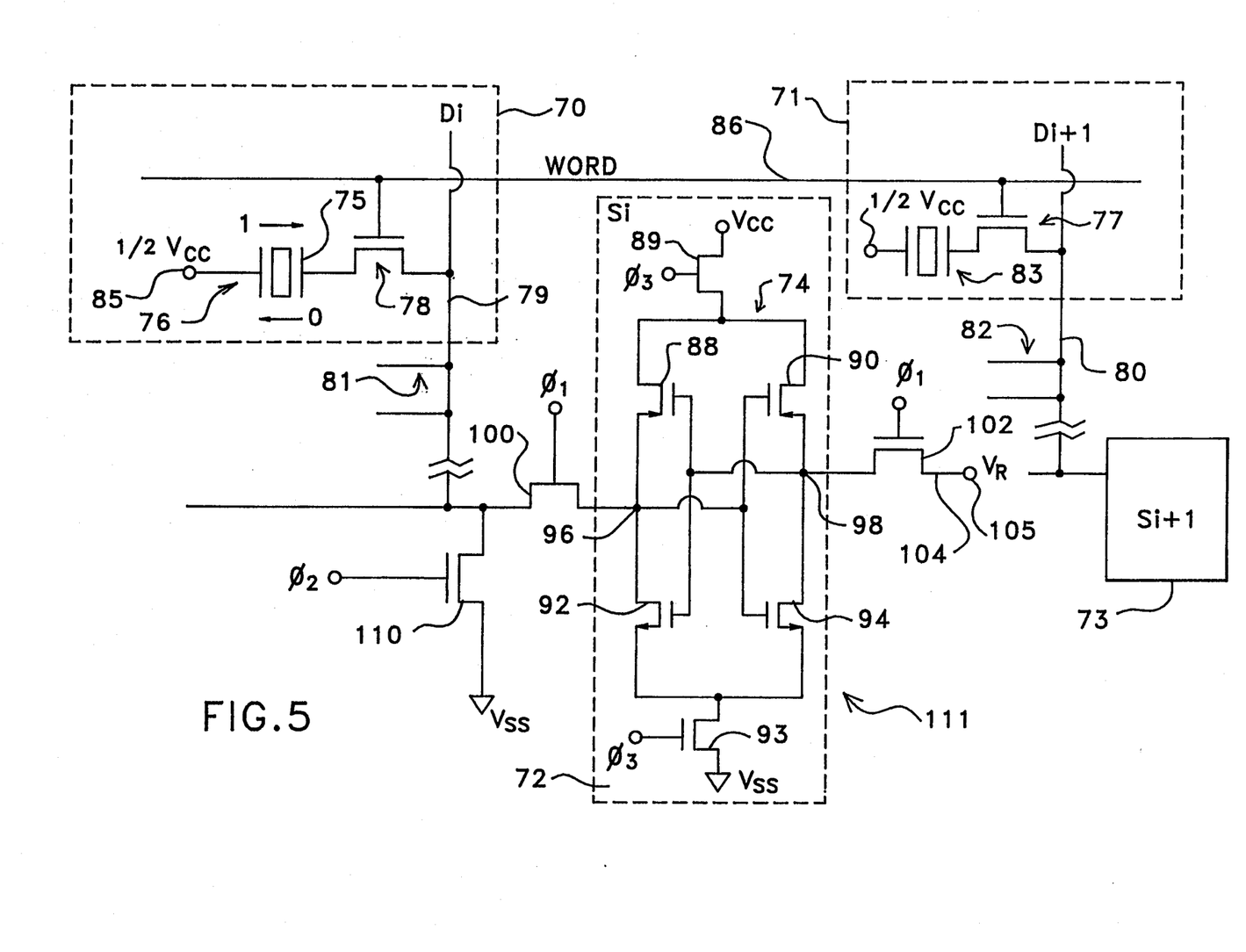
FIG. 5 is a circuit diagram of the preferred embodiment of a memory array according to the invention combining the 1T, 1C cell of FIG. 1 with sense and restore circuitry according to the invention.
Figure 13:
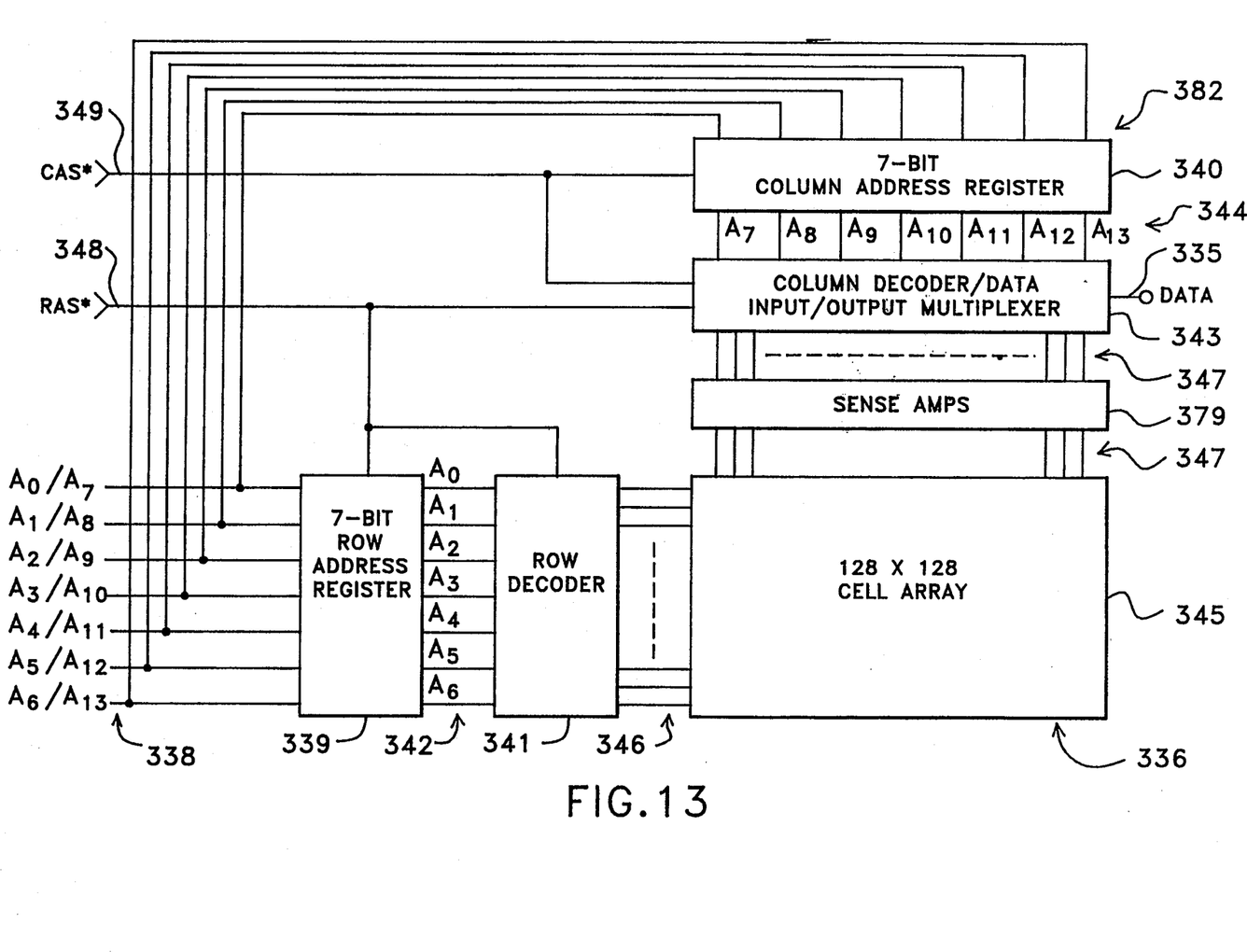
FIG. 13 shows an exemplary embodiment of a memory according to the invention.

A memory is fabricated by arranging many memory cells in rows and columns called an array. An exemplary memory 336 including a memory array 345 is shown in FIG. 13. Associated with the array 345 is a bank 379 of sense amplifiers. Referring to FIGS. 5 and 13, each of the memory cells such as 70 in array 345 is connected or connectable to a sense amplifier 72 in the bank 379 of sense amplifiers.

Each of the memory cells discussed above and below include a ferroelectric capacitor, such as 14 in FIG. 1. In ferroelectric capacitors, the material 17 between the plates 20, 22 is a ferroelectric. As is well-known, a ferroelectric capacitor is capable of existing in two different states of polarization, represented by the arrows 28 below capacitor 14. These states of polarization are created by an electric field of sufficient strength placed across the capacitor plates 20 and 22. If the field is in the direction from right to left in FIG. 1, then a polarization in the same direction (the direction of the upper arrow) remains after the field is removed. If the field is in the left-to-right direction, a polarization in the same direction (the direction of the lower arrow) remains after the field is removed. Thus, in one polarization state the ferroelectric capacitor 14 is polarized in the direction of the upper arrow, and in the other polarization state the ferroelectric capacitor 14 is polarized in the direction of the lower arrow. The ferroelectric memory is designed so that one polarization state corresponds to a logic "1" and the other polarization state corresponds to a logic "0". The state of polarization is generally sensed by a sense amplifier, which amplifies the signal put out by the capacitor to a level that can be read by circuitry external of the memory array. The memories discussed herein are of a variety termed DRO (destructive readout) because at least one of the polarization states is destroyed in the process of reading it. In such memories the polarization must be restored to its original value after reading for the memory to retain the same information after reading as it did before reading.

Figure 7:
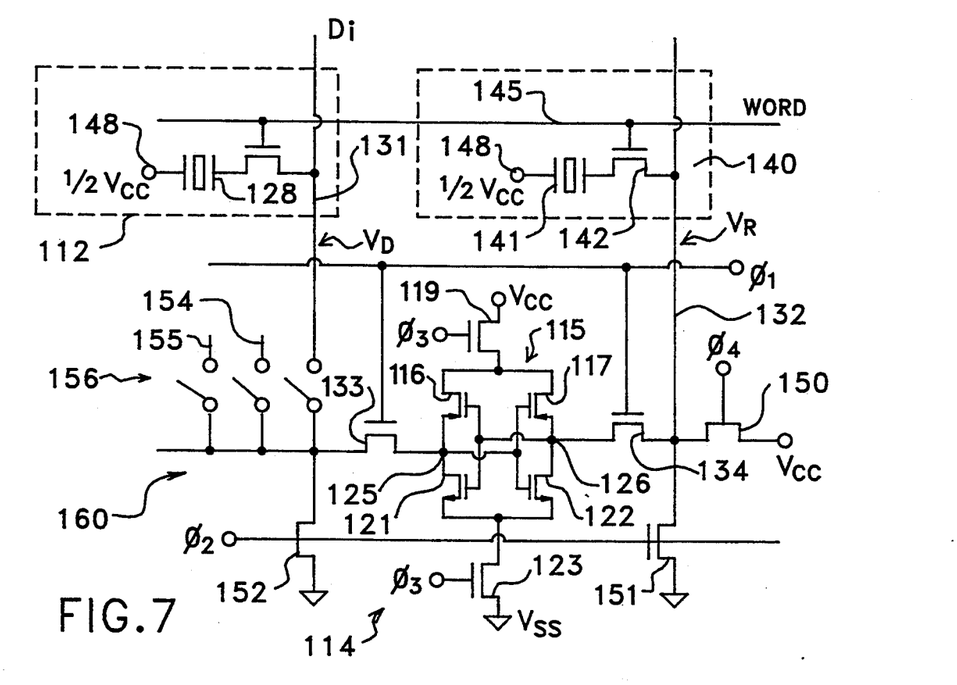
FIG. 7 is a circuit diagram of the preferred embodiment of a memory array according to the invention utilizing a ferroelectric dummy capacitor circuit to provide the reference voltage.
Figure 8:
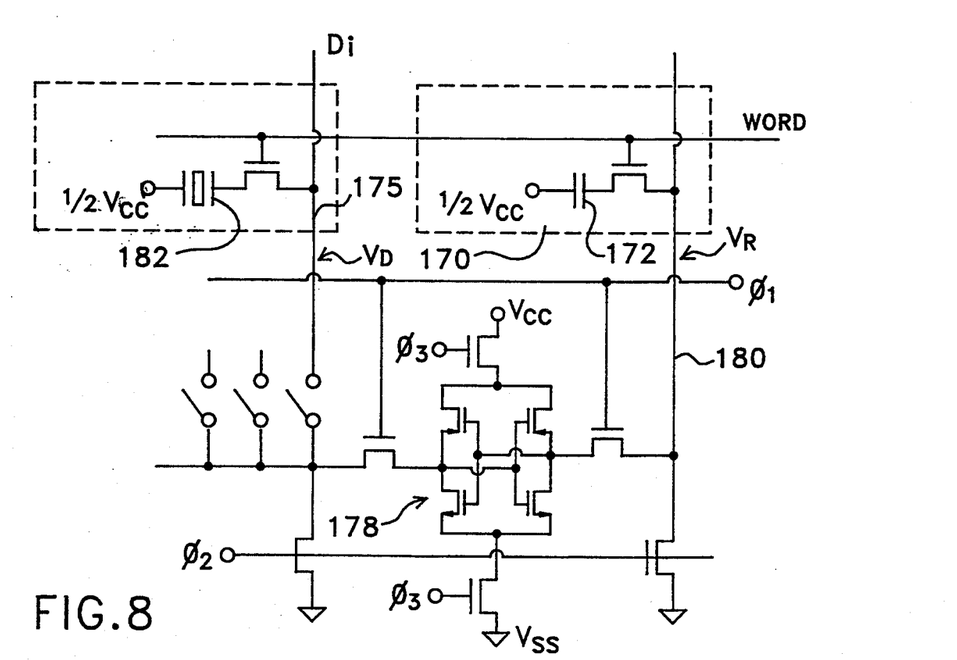
FIG. 8 is a circuit diagram of the preferred embodiment of a memory array according to the invention utilizing a linear dummy capacitor circuit to provide the reference voltage.
Figure 9:
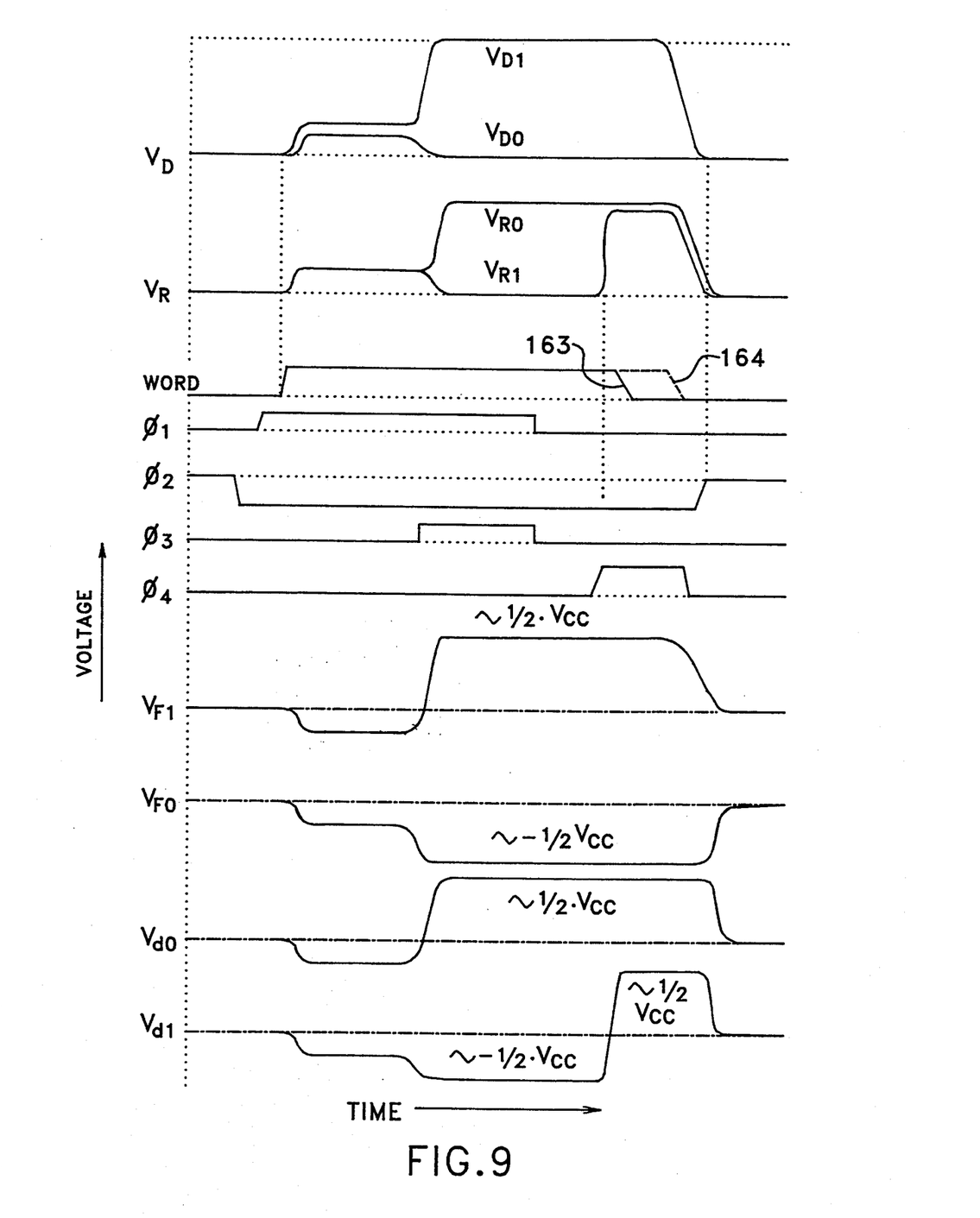
FIG. 9 is a timing diagram for the circuit of FIG. 7.
Figure 10:
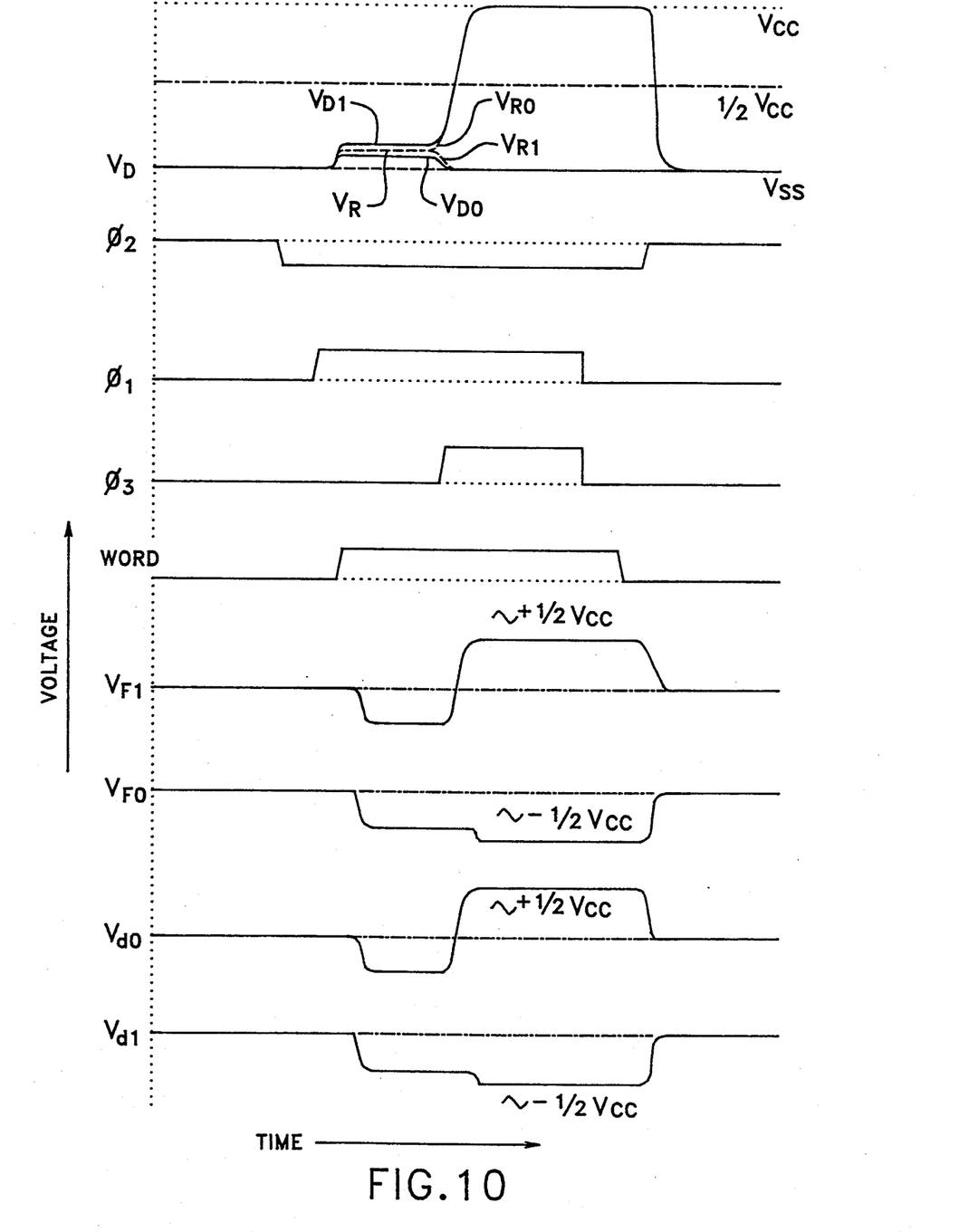
FIG. 10 is a timing diagram for the circuit of FIG. 8.
Figure 11:
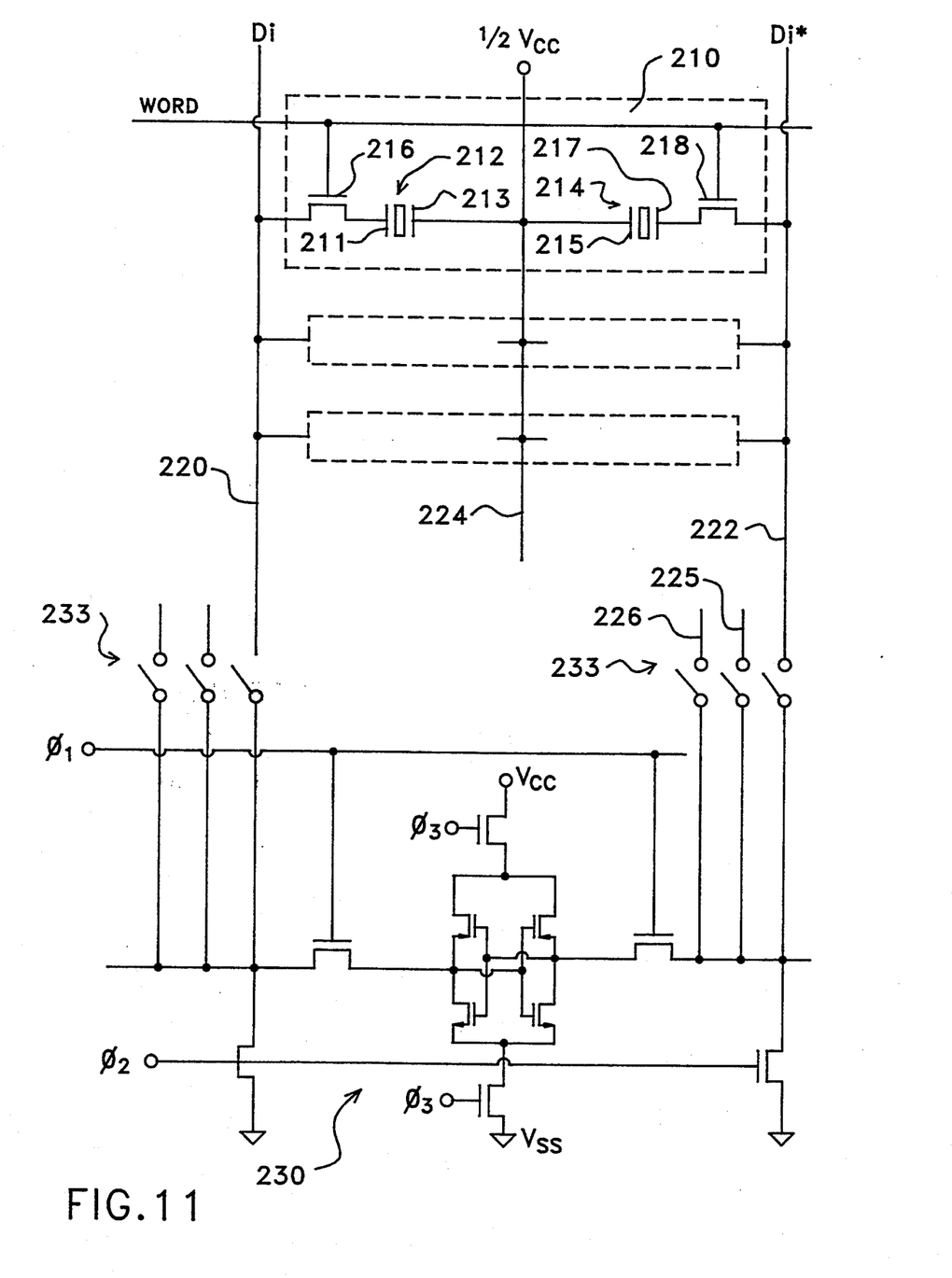
FIG. 11 is a circuit diagram of the preferred embodiment of a memory array according to the invention combining a 2T, 2C cell memory cell with sense and restore circuitry according to the invention.

According to the invention, each sense amplifier, such as 72 (FIG. 5), is simple, preferably a cross-coupled latch 74, and senses the state of the ferroelectric capacitor 76 in memory cell 70, amplifies it, and restores it to its original state in one operation. Other embodiments of memory cell and sense amp combinations are shown in FIGS. 7, 8, and 11. Timing diagrams useful in understanding the operation of the circuits of FIGS. 5, 7, 8, and 11, are shown in FIGS. 6, 9, 10, and 12 respectively.

2. Detailed Description of the Memories According to the Invention

Turning now to a more detailed description of the invention, FIG. 5 shows a portion of a memory utilizing 1T, 1C memory cells 70, 71. Each memory cell contains a ferroelectric capacitor 76 and a transistor 78. This memory cell thus has the structure of the memory cell of FIG. 1. Memory cell 70 is in the ith column of memory array 345 and memory cell 71 is in the (i+1)th column. In each column there are a plurality of identical memory cells, which is indicated by the lines 81, 82. The capacitor, such as 76, in each memory cell in the ith column is connected to bit line 79 via its associated transistor 78, while the capacitors, such as 83, in each memory cell in the (i+1)th column are similarly connected to bit line 80. Bit line 79 is labeled Di to indicated it carries the ith digit or bit line signal while bit line 80 is labeled Di+1 to indicate it carries the (i+1)th digit or bit line signal. The ith column of memory cells is connected to the ith sense amplifier 72 and the (i+1)th column is connected to the (i+1)th sense amplifier 73. It should be understood that embodiments in which more than one sense amplifier is associated with each column, or a single sense amplifier is associated with a plurality of columns, are also contemplated by the invention. A word line is associated with each row of memory cells, such as word line 86 which is connected to the gate of each transistor, such as 77 and 78, in the row containing cells 70 and 71. In each memory cell, such as 70, the side of the capacitor, such as 76, not connected to the transistor is connected to a source 85 of constant voltage, which is preferably ½ the supply voltage, Vcc.

Sense amplifier 72 preferably comprises a cross-coupled latch 74 comprising two p-type transistors 88 and 90 and two n-type transistors 92 and 94. The drains of the p-channel transistors 88 and 90 are connected to each other and also to the Vcc voltage via latch enable transistor 89; the sources of the n-channel transistors 92 and 94 are connected to each other and also to the Vss voltage via latch enable transistor 93. The source of p-channel transistor 88 is connected to the drain of n-channel transistor 92. The source of p-channel transistor 90 is connected to the drain of n-channel transistor 94. The node 96 between p-channel transistor 88 and n-channel transistor 92 is connected to the gates of transistors 90 and 94, while the node 98 between p-channel transistor 90 and n-channel transistor 94 is connected to the gates of transistors 88 and 92. The gates of latch enabling transistors 89 and 93 are connected to the $\phi_3$ signal input. Preferably Vcc is a positive five volts and Vss is zero volts. The cross-coupled latch just described is a well-known CMOS cross-coupled latch. Other latches that drive the higher of two nodes to the logic "1" voltage and the lower of two nodes to the logic "0" voltage can be substituted for the latch 74.

Node 96 of latch 74 is connected to the bit line 79 via transistor 100, while node 98 is connected to a reference voltage line 104 via transistor 102. Preferably, reference voltage line 104 is connected to a source 105 of a reference voltage $V_R$. Preferably $V_R$ is between the voltage assumed by the previously uncharged bit line 79 when the ferroelectric capacitor 76 is connected to it while in a logic "0" polarization state and the voltage assumed by the previously uncharged bit line 79 when ferroelectric capacitor 76 is connected to it while having a logic "1" polarization state. This voltage shall be discussed in more detail below. The gates of transistors 100 and 102 are connected to a line carrying the $\phi_1$ signal. Bit line 79 is also connected to the Vss (ground) voltage via precharge transistor 110 which has its gate connected to the $\phi_2$ signal line.

Figure 6:
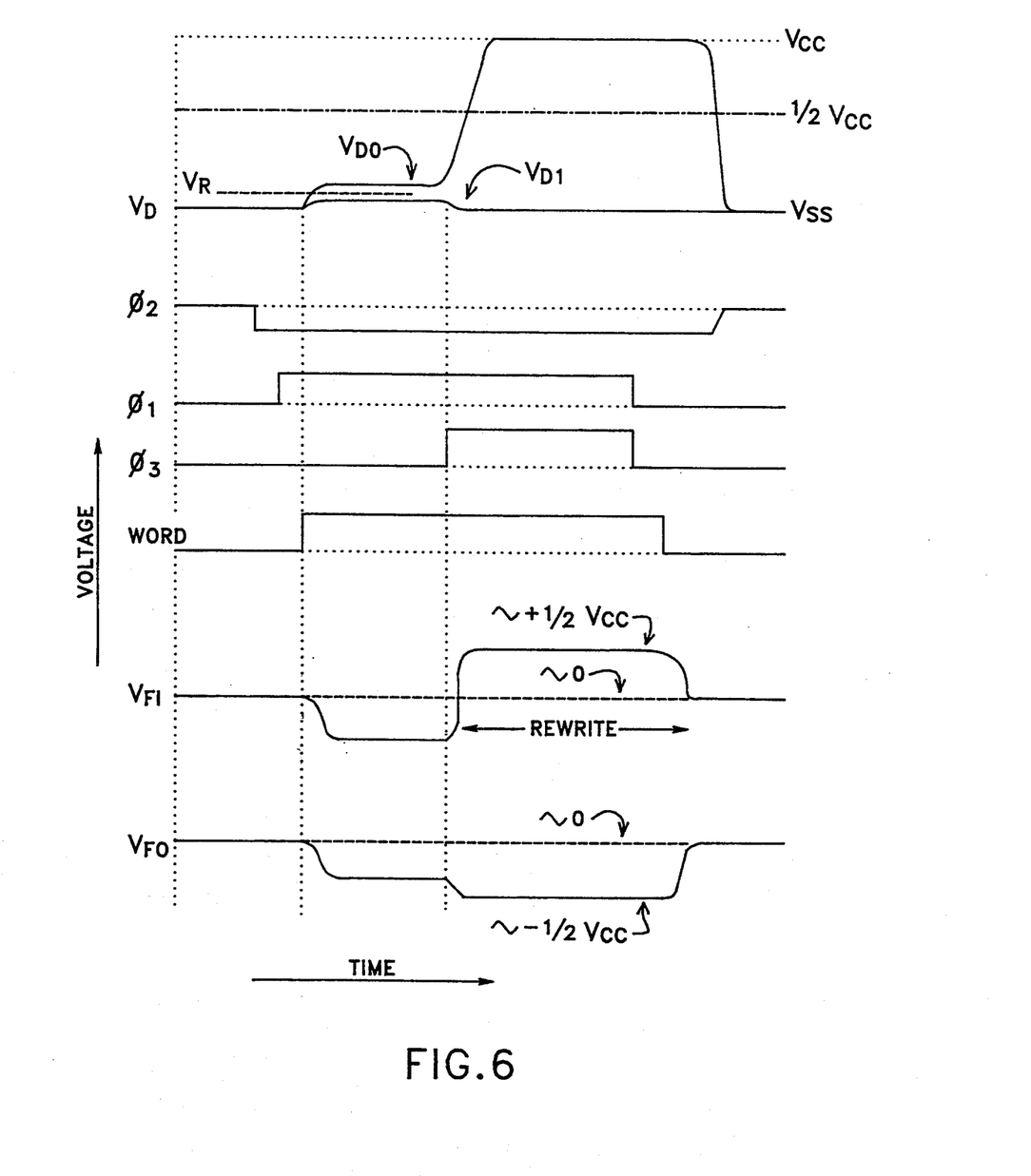
FIG. 6 is a timing diagram for the circuit of FIG. 5.

FIG. 6 is a timing chart showing the timing of the various signals input to and output by the circuit of FIG. 5 during a read cycle. In the timing charts and the discussion below, a voltage or other value that refers to bit line will be labeled with an upper case subscript "D". A voltage or other parameter that refers to a dummy capacitor, such as 83, will generally be labeled with a lower case subscript "d". A voltage or other parameter that refers to an operating ferroelectric capacitor, such as 76, will be labeled with a subscript "f". A voltage that refers to a state when the operating capacitor (as opposed a dummy capacitor) is in a logic "0" state will be labeled with a subscript "0", and voltage that refers to a state when the operating capacitor is in a logic "1" state will be labeled with a subscript "1". Thus, $V_D$ is the voltage on bit line 79, $V_{D1}$ is the voltage on the bit line 79 when the capacitor 76 is in a logic "1" state, that is, polarized in the direction of the arrow labeled 1 in FIG. 5, and $V_{D0}$ is the voltage on the bit line 79 when the capacitor 76 is in a logic "0" state, that is polarized in the direction of the arrow labeled 0 in FIG. 5. The voltage across the ferroelectric capacitor 76 when the capacitor is polarized in the logic "1" direction prior to the read process is designated by $V_{f1}$ and the voltage across the ferroelectric capacitor 76 when the capacitor is polarized in the logic "0" direction prior to the read process is designated by $V_{f0}$. The other signals are as designated in FIG. 5.

Referring to the timing diagram of FIG. 6, before the read cycle starts, $\phi_2$ is high, thus bit line 79 is connected to ground via transistor 110 which discharges any charge that had previously been on the line. At the initiation of the read cycle, $\phi_2$ goes to zero, thus turning off transistor 110. Then after a short delay to be sure that the bit line 76 and node 96 are completely isolated from the Vss voltage, $\phi_1$ goes high, connecting the nodes 96, 98 of sense amplifier 72 to the bit line 79 and the reference voltage line 104, respectively. Then after another short delay to allow the bit line to stabilize, the word line 86 goes high connecting capacitor 76 to the bit line 79. Since the bit line is at ground and has substantial capacitance, $C_D$, a voltage of almost $-\frac{1}{2}$Vcc is placed across capacitor 76. If the capacitor 76 is polarized in the logic "0" direction, then it is already polarized in the direction of the field, and the charge, $Q_l$, that it develops will be determined by its linear capacitance, $C_l$, and is approximately $Q_l = C_l(-\frac{1}{2}\text{Vcc})$. A negative charge will be developed on the plate 75A of capacitor 76. Thus when the capacitor is in the logic "0" state, the movement of negative charge to the capacitor 76 will develop a positive voltage, $V_{D0}$, on the bit line 79 approximately equal to:

$$V_{D0} = Q_l/C_D. \quad (1)$$

If however, the capacitor 76 is polarized in the logic "1" direction, the polarization will initially be opposite to the direction of the field, and the field will cause the polarization to switch polarization states. The switching of the polarization state of capacitor 76 will cause an additional negative charge, $Q_{sw}$, to be drawn to capacitor 76, and therefore an additional positive voltage, $Q_{sw}/C_D$, will be developed on bit line 79. Thus, in the case of the memory cell being in the logic "1" state, the net voltage, $V_{D1}$, developed on the bit line 79 will be approximately equal to:

$$V_{D1} = Q_l/C_D + Q_{sw}/C_D. \quad (2)$$

The ferroelectric capacitor 76 should be selected so that $Q_{sw} >> Q_l$ so that the discrimination between the logic "1" voltage or the logic "0" voltage developed on bit line 79 the reference voltage 105 will be greater than the noise margin, that is, between 200 mV and 500 mV. From the above it is seen that $Q_l/C_D < V_R < Q_{sw}/C_D + Q_l/C_D$.

From the above it is seen transistor 78 is a switch means for permitting charge to be transferred from the ferroelectric capacitor 76 to the bit line 79, and that while the charge transfer is taking place, the logic state on the ferroelectric capacitor 76 is destroyed if the capacitor 76 was originally in a logic "1" state. Thus, in the case of the capacitor being in the logic "1" state, the capacitor 76 needs to be restored to its original state.

After the voltage $V_{D0}$ or $V_{D1}$ rises on bit line 79, the signal $\phi_3$ goes high. This turns on transistors 89 and 93 and activates sense amplifier 72, that is, enables latch 74. If the voltage on bit line 79 is higher than reference voltage source 105, then gate transistor 88 will conduct better than transistor 90, since these are p-type transistors and the higher the voltage on their gates, the less they conduct. Further, transistor 94 will conduct better than transistor 92 since these are n-type transistors, as a result, the voltage at node 96 will increase while the voltage at node 98 will decrease. This in turn will further turn on transistors 94 and 88 and further turn off transistors 90 and 92, and so on, causing node 96 to rapidly go to Vcc and node 98 to rapidly go to Vss. This latches the latch 74 with node 96 at Vcc and node 98 at Vss. The Vcc voltage on bit line 79 does two things: first, it causes a logic "1" to be output as the Di signal to the circuit external of array 345 (FIG. 13) on one of lines 347; second, it causes a voltage of $\frac{1}{2}$Vcc to be placed across capacitor 76 in a direction to cause a polarization in the direction of the logic "1" arrow. Thus, the polarization is restored to the original logic "1" state.

If the voltage on bit line 79 is lower than reference voltage 105, then node 96 is driven to Vss while node 98 is driven to Vcc, which latches latch 74 in the state with node 98 at Vcc and node 96 at Vss. This again does two things: first, it causes a logic "0" to be output as the Di signal to the circuit external of array 345 (FIG. 13) on one of lines 347; second, it causes a voltage of $\frac{1}{2}$Vcc to be placed across capacitor 76 in a direction to cause a polarization in the direction of the logic "0" arrow. Thus, the polarization remains in the original logic "0" state.

As a result of the above, it can be seen that the sense amplifier 72 both reads and restores or "rewrites" the memory cell 70 in a single electronic operation. That is, the same electronic operation of driving bit line 79 to a logic state determined by the state of capacitor 76 prior to charge transfer also restores ferroelectric capacitor 76 to the state it was in prior to the charge transfer. By "a single electronic operation" is meant that no additional electronic operations, such as a logic gate operation, a signal going high or low, etc. need to take place between the bit line 79 going high and the capacitor 76 being restored for the restoration to occur. This significantly increases the speed of the read/rewrite operation. It is also noted that the constant voltage source 85 contributes to this speed since no voltage change on the plate 75B of capacitor 76 not connected to the bit line 79 is required. In other words, sense amplifier 72 and constant voltage source 85 together comprise read/rewrite circuit means 111 for, in a single electronic operation, both driving the bit line 79 to a logic state determined by the state of capacitor 76 prior to the charge transfer and restoring the ferroelectric capacitor 76 to the state it was in prior to the charge transfer.

After the state of capacitor 76 is restored, the signals $\phi_1$ and $\phi_3$ then go low, causing transistors 100, 102 and 89, 93, respectively to turn off. The word line 86 then goes low, disconnecting capacitor 76 from bit line 79. The exact timing of the word line 86 going low is not critical, except that it should be sufficiently before $\phi_2$ going high to be sure transistor 78 is completely off. Then the $\phi_2$ signal returns high, turning on transistor 110 and discharging bit line 79.

Turning to FIG. 7 an alternative preferred embodiment of a memory according to the invention is shown. In this embodiment memory cell 112 again comprises a 1T, 1C memory cell as in the embodiment of FIG. 5. The sense amplifier 114 is again comprises a cross-coupled latch 115, with the drains of the p-type transistors 116, and 117 connected to Vcc through latch enable transistor 119 and the sources of n-type transistors 121 and 122 connected to Vss through latch enable transistor 123, and the nodes 125 and 126 connected to the bit line 131 and reference line 132 through transistors 133 and 134, respectively. In this embodiment the reference voltage is provided by a dummy 1T, 1C memory cell 140 containing a ferroelectric capacitor 141 and a transistor 142. The gate of the transistor 142 of the dummy cell 140 is connected to the word line 145 for the row containing cell 112. Reference voltage line 132 is connected to one side of capacitor 141 through transistor 142 while the other side of dummy capacitor 141 is connected to the constant voltage source 148. Reference line 132 is also connected to Vcc through dummy cell rewrite transistor 150 and to Vss through discharge transistor 151. The gate of transistor 150 is connected to the $\phi_4$ signal, while the gate of transistor 151 is connected to the $\phi_2$ signal. The embodiment of FIG. 7 also differs from the embodiment of FIG. 5 in that the sense amplifier 160 may be connected to any one of a number of bit lines 131, 154, 155 etc. by a y-selecting multiplexer 156. However, an arrangement wherein there is a separate sense amplifier and dummy cell for each column of memory cells, that is for each bit line, and many other variations are also possible. In this embodiment there are also other rows of memory cells, each including a dummy cell connected to reference line 132, but these are not shown.

In the embodiment of FIG. 7, the dummy cell 140 is always "rewritten" to a logic "1" and the memory cell 112 is compared to it to determine if it is a logic "1" or a logic "0" state. The timing diagram for the memory of FIG. 7 is shown in FIG. 9. In addition to the voltages given in the timing chart of FIG. 6, FIG. 9 also shows $V_R$, the voltage on the reference voltage line 132, $\phi_4$, the voltage $V_{d0}$, which is the voltage across the dummy capacitor 141 when the operating memory cell 112 is in the logic "0" state, and $V_{d1}$, which it the voltage across the dummy capacitor 141 when the memory cell 112 is in the logic "1" state. The bit line 131 and the reference line 132 are both discharged prior to the read cycle by the signal $\phi_2$ going high to turn on transistors 151 and 152. The read cycle starts by $\phi_2$ going low to turn off transistors 151 and 152. Then $\phi_1$ goes high connecting sense amplifier 114 to bit line 131 and reference line 132. The word line 145 then goes high, connecting capacitor 128 to bit line 131 and dummy capacitor 141 to reference line 132. Just as in the embodiment of FIG. 5, a voltage:

$$V_{D1} = Q_{lf}/C_D + Q_{sw}/C_D \qquad (3)$$

is developed on bit line 131 if capacitor 128 is in the logic "1" state, where $Q_{lf}$ is the charge developed on the operating ferroelectric capacitor 128 due to its linear capacitance, $C_D$ is the capacitance of bit line 132, and $Q_{sw}$ is the switching charge of the operating capacitor 128. Likewise a voltage:

$$V_{D0} = Q_{lf}/C_D \qquad (4)$$

is developed on the bit line 131 if the operating capacitor 128 is in the logic "0" state. The dummy bit line, i.e., the reference line 132, always assumes a voltage determined by its logic "1" state. Thus the voltage, $V_R$, developed on the reference line 132 will be:

$$V_R = Q_{ld}/C_R + Q_{swd}/C_R \qquad (5)$$

where $Q_{ld}$ is the charge developed on the dummy capacitor 141 due to its linear capacitance, $C_R$ is the capacitance of the reference line 132, and $Q_{swd}$ is the switching charge of the dummy capacitor 141. Assuming that the dummy capacitor 141 is made of the same material and has the same thickness as the ferroelectric capacitor 128, if the voltage developed on the reference line 132 is to be between $Q_{lf}/C_D$ and $Q_{sw}/C_D + Q_{lf}/C_D$, one can calculate what the area of the dummy capacitor, $A_d$, should be. Writing the voltage developed across the operating capacitor 128 as $V_f$, the linear capacitance of the dummy capacitor 141 as $C_{ld}$, and the area of the operating ferroelectric capacitor 128 as $A_f$, then:

$$C_{lf} = \epsilon A_f/d, \qquad (6)$$

and $$C_{ld} = \epsilon A_d/d, \qquad (7)$$

where $\epsilon$ is the dielectric constant of the ferroelectric material in the capacitors 128 and 141, and d is the thickness of the capacitors. From equations (3) and (4) we get:

$$C_{ld} = A_d C_{lf}/A_f. \qquad (8)$$

Then assuming the switching voltage is sufficient to completely switch both the operating capacitor 128 and the dummy capacitor 141, since the only difference in the capacitors is their area and the charge on developed by the capacitor is proportional to the area of the capacitor, then:

$$Q_{swd} = Q_{sw} A_d/A_f. \qquad (9)$$

Using the well-known relation between charge, voltage and capacitance for a linear capacitor, $Q_{lf} = C_{lf} V_f$ and $Q_{ld} = C_{ld} V_d$, assuming that $V_{f1} \approx V_{f0} \equiv V_f$ during the relevant portion of the read cycle, and substituting the foregoing equations into equations (3), (4), and (5), we get:

$$V_{D1} = (C_{lf} V_f + Q_{sw})/C_D, \qquad (10)$$

$$V_{D0} = (C_{lf} V_f)/C_D, \qquad (11)$$

and $$V_R = (C_{ld} V_d + Q_{swd})/C_R. \qquad (12)$$

Then substituting equations (8) and (9) in equation (12) we get:

$$V_R = (A_d/A_f)(C_{lf} V_d + Q_{sw})/C_R. \qquad (13)$$

Then since we want $V_R$ to be halfway between $V_{D0}$ and $V_{D1}$, $$V_{D1} - V_R = V_R - V_{D0}. \qquad (14)$$

Substituting equations 10, 11, and 13, in equation 14 and simplifying, we get:

$$A_d = (A_f/2)(C_R/C_D)(2C_{lf} V_f + Q_{sw})/(C_{lf} V_d + Q_{sw}) \qquad (15)$$

as a general formula to determine the area of the dummy ferroelectric capacitor 141 in terms of the area of the operating ferroelectric capacitor 128. Examining this equation, one can see that since $V_D$ is less than $V_f$, therefore if $Q_{sw} >> Q_l = C_{lf} V_f$, then $Q_{sw} >> C_{lf} V_d$, and generally in this case the term $(2C_{lf} V_f + Q_{sw})/(C_{lf} V_d + Q_{sw})$ will be close to 1 or slightly greater than 1. Thus, if $C_R$ and $C_D$ are about equal, then $A_d = A_f/2$. In the limit that $Q_{sw}$ becomes smaller than $Q_{lf}$, the term $(2C_{lf} V_f + Q_{sw})/(C_{lf} V_d + Q_{sw})$ becomes equal to about 2, or $A_d = A_f$. Thus in general, $$A_f/2 < A_d < A_f. \qquad (16)$$

That is, if the area of the dummy capacitor 141 is less than the area of the ferroelectric capacitor 128, then it will draw less current than capacitor 128 when capacitor 128 is polarized in the logic "1" state. And if the area of capacitor 141 is larger than one-half the area of the capacitor 128, capacitor 141 will always draw more current than capacitor 128 when it is in the logic "0" state, since capacitor 141 is always in the logic "1" state, and $Q_{sw} >> Q_l$. Preferably, $A_d$ is closer to $A_f/2$ than to $A_f$.

While the relationship of equation (16) was determined by setting $V_{D1} - V_R = V_R - V_{D0}$, even if this latter equation is only approximately true, the relationship (16) is still valid. Generally, $V_R$ will be within a range, $\pm \delta$, of being halfway between $V_{D0}$ and $V_{D1}$, 200 mV $< V_{D1} - V_R <$ 400 mV, and 200 mV $< V_R - V_{D0} <$ 400 mV. Finally, it should be noted that one should use a value of $Q_{sw}$ that is degraded by fatigue such as when the capacitor is exposed to $1 \times 10^6$ switching cycles. Roughly taking a noise margin of $\Delta V = 200$ mV, a specific switching charge, $q_{sw} = Q_{sw}/A$, of 15 $\mu C/cm^2$ that is typical of a layered superlattice material such as strontium bismuth tantalate, a bit line capacitance, $C_D = m \times C_d$, where $C_d$ is the digit line capacitance of a single cell and is equal to about 10 fF/cell, assuming 256 cells on a bit line, and assuming the reference voltage is about halfway between $V_{D0}$ and $V_{D1}$, then, $\Delta V = (V_{D1} - V_{D0})/2 = Q_{sw}/(2C_D) = (q_{sw} A)/(2C_D)$, and the area of the ferroelectric capacitor is:

$$A_f = 2C_D \Delta V / q_{sw} \qquad (17)$$
$$= (2 \times 256 \times 10 \text{ fF} \times .2 \text{ V})/(15 \ \mu C/cm^2)$$
$$= (2 \times 256 \times 10 \times 10^{-15} \text{ F} \times .2 \text{ V})/(15 \times 10^{-6} \text{ C/cm}^2)$$
$$= 6.822 \times 10^{-8} \text{ cm}^2$$

or the capacitor is about 2.61 $\mu m \times 2.61 \ \mu m$.

When the respective voltages are developed on the bit line 131 and reference line 132, $\phi_3$ goes high activating sense amplifier 114. The voltage on the bit line is driven high or low as before depending on whether cell 112 was in the logic "1" or the logic "0" state, respectively. Again the sense amplifier 114 automatically "rewrites" the logic "1" state or reinforces the logic "0" state. However, the ferroelectric capacitor 141 in the dummy cell 140 will not be rewritten to a logic "1" if the memory cell 112 is in the logic "1" state. Therefore, after $\phi_3$ and $\phi_1$ go low, $\phi_4$ goes high, which turns on transistor 150 and forces reference line 132 high, thereby placing a voltage of $\frac{1}{2}$Vcc across capacitor 141 and restoring it to the logic "1" state. Word line 145 goes low while $\phi_4$ is high; the exact timing is not critical—it may take place any time between the solid line 163 and the dotted line 164—as long as it is between $\phi_4$ and $\phi_2$ going high. Then $\phi_4$ goes low and $\phi_2$ goes high to end the cycle and prepare for the next one.

FIG. 8 shows a third preferred embodiment of the memory according to the invention. This embodiment is the same as that of FIG. 7, except that the dummy cell 170 includes a linear capacitor 172 rather than a ferroelectric capacitor 182. In addition, there is no dummy "rewrite" transistor. The timing chart for the circuit of FIG. 8 is shown in FIG. 10. In this case the timing of the signals and the voltages developed on the bit line 175 through the disconnecting of the sense amplifier 178 are the same as in FIG. 6, thus they will not be repeated. Again the area of the dummy linear capacitor 172 can be calculated in terms of the area of the operating ferroelectric capacitor 182 from the requirement that $V_R$ be about halfway between $V_{D1}$ and $V_{D0}$. In this case:

$$V_R = Q_{ld}/C_R = C_{ld} V_d / C_R, \qquad (18)$$

and since $C_{lf}$ may not be the same as $C_{ld}$, and if the capacitors are the same thickness, $C_{ld}$ is equal to:

$$C_{ld} = (\epsilon_d / \epsilon_f)(A_d / A_f) C_{lf}, \qquad (19)$$

where $\epsilon_d$ is the dielectric constant of the dummy capacitor and $\epsilon_f$ is the dielectric constant of the ferroelectric capacitor, then:

$$A_d = (A_f/2)(C_R/C_D)(\epsilon_f / \epsilon_d)(2C_{lf}V_f + Q_{sw})/(C_{lf}V_d) \qquad (20)$$

or in the more general case when the thickness, d, is not the same:

$$A_d = -(A_f/2)(C_R/C_D)(\epsilon_f/\epsilon_d)(d_d/d_f)(2C_{lf}V_f+Q_{sw})/(C_{lf}V_d), \qquad (21)$$

where $d_d$ is the thickness of the dummy capacitor 172 and $d_f$ is the thickness of the ferroelectric operating capacitor 182.

With the above value for the capacitance of capacitor 172, the timing chart of FIG. 10 remains the same as that for FIG. 6, and essentially the same as that of FIG. 9, except that there is no dummy restore cycle. The reference line 180 is left to take the opposite value of the bit line 175, and the voltage across the linear capacitor 141 also takes the opposite sign to the value across the ferroelectric capacitor 182. Since the linear capacitor is not ferroelectric, there is no need to pay attention to the charge placed across it.

FIG. 11 shows a fourth embodiment of the memory according to the invention. In this embodiment, the memory cell 210 is a 2T, 2C cell. Each cell, such as 210, has two ferroelectric capacitors 212 and 214 which are identical. One plate 211 of capacitor 212 is connected to bit line 220 via transistor 216, while one plate 217 of capacitor 214 is connected to reference line 222 via transistor 218. The other plates 213 and 215 of capacitors 212 and 214, respectively, are connected to the constant voltage source via line 224. In this embodiment, the capacitors 212 and 214 take on opposite states, and the signals Di and Di* on the bit line 220 and reference line 222 are the inverse of each other. The sense amplifier 220 and its connection to the bit line 220, is the same as that of the circuit of FIG. 8, but now there are double the number of switches in the y-multiplexer 233, since there are a plurality of reference lines 222, 225, 226 etc., and connection must be made to these reference lines as well as the bit lines.

Figure 12:
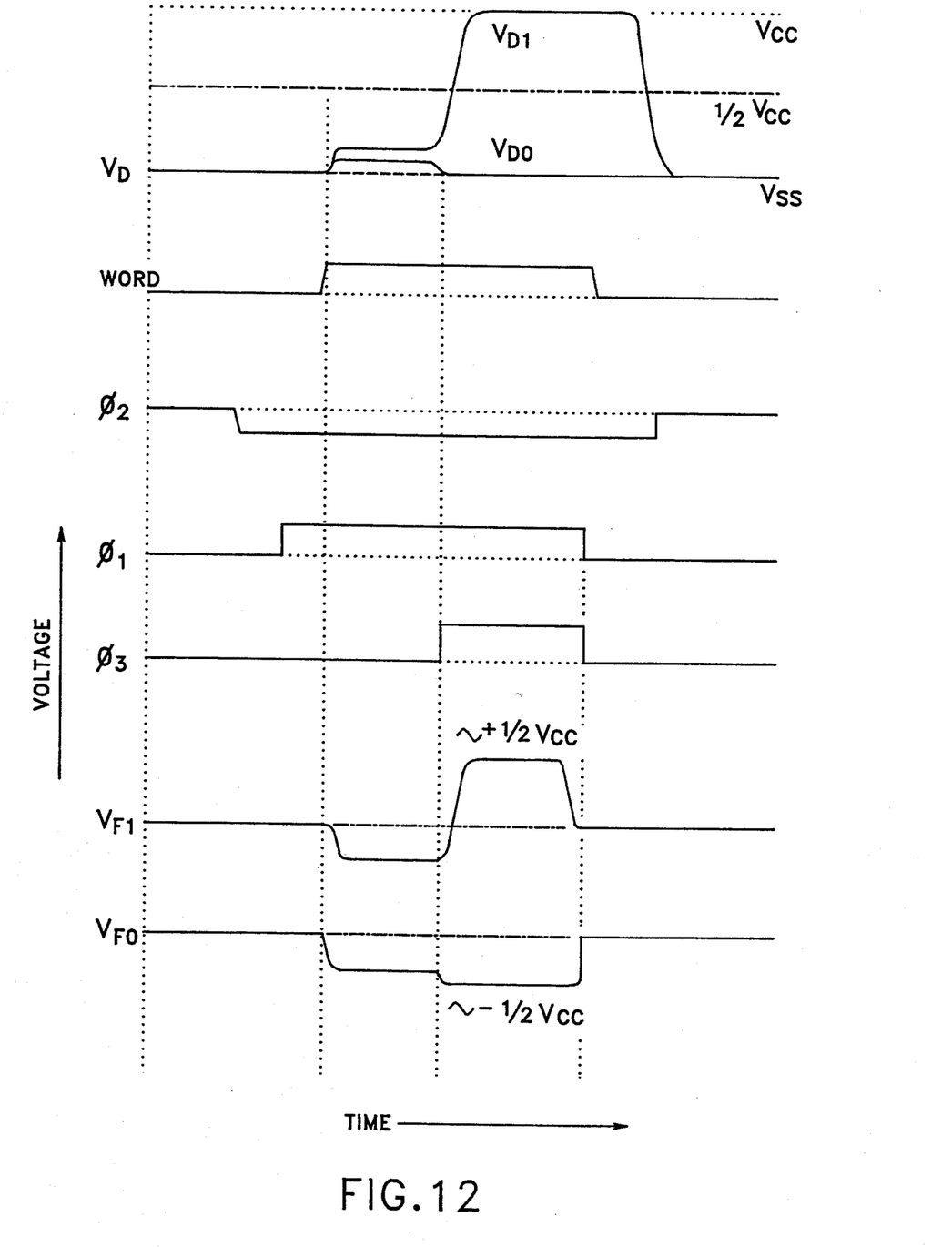
FIG. 12 is a timing diagram for the circuit of FIG. 11.

A timing chart for the circuit of FIG. 11 is shown in FIG. 12. The signals and voltages developed on the bit line 220 are essentially the same as in FIG. 6, thus will not be repeated. In this case, if cell 210 is in the logic "1" state, that is, capacitor 212 is polarized in the logic "1" state and capacitor 214 is polarized in the logic "0" state, then the voltage developed on bit line 220 will be $Q_{sw}/C_D + Q_l/C_D$, and the voltage developed on reference line 222 will be $Q_l/C_D$. Since the voltage on line 222 will be smaller, the sense amplifier 230 will force line 220 to Vcc and line 222 to Vss. Similarly if cell 210 is in the logic "0" state, that is, capacitor 212 is polarized in the logic "0" state and capacitor 214 is polarized in the logic "1" state, then the voltage developed on reference line 222 will be $Q_{sw}/C_D+Q_l/C_D$, and the voltage developed on bit line 220 will be $Q_l/C_D$. Since the voltage on line 220 will be smaller, the sense amplifier 230 will force line 222 to Vcc and line 220 to Vss. Both capacitor 212 and capacitor 214 are restored to their original states in the reading process.

FIG. 13 is a block diagram illustrating an exemplary integrated circuit memory 336 in which memory cells according to the invention are utilized. For simplicity, the embodiment shown is for a 16K×1 DRAM; however, the invention may be utilized in a wide variety of sizes and types of non-volatile memories. In the 16K embodiment shown, there are seven address input lines 338 which connect to a row address register 339 and a column address register 340. The row address register 339 is connected to row decoder 34 1 via seven lines 342, and the column address register 340 is connected to a column decoder/data input output multiplexer 343 via seven lines 344. The row decoder 341 is connected to a 128×128 memory cell array 345 via 128 lines 346, and the column decoder/data input output multiplexer 343 is connected to the sense amplifiers 379 and memory cell array 345 via 128 lines 347. A RAS* signal line 348 is connected to the row address register 339, row decoder 341, and column decoder/data input/output multiplexer 343, while a CAS* signal line 349 is connected to the column address register 340 and column decoder/data input output multiplexer 343. An input/output data line 335 is connected to the column decoder/data input output multiplexer 343.

Memory cell array 345 contains 128×128=16,384 memory cells, which is conventionally designated as 16K. The cell array 345 and the sense amplifiers 347 associated with it may include any of the combinations of memory cells and sense amplifiers discussed above. The operation of the memory 336 is as follows. Row address signals $A_0$ through $A_6$ and column address signals $A_7$ through $A_{13}$ placed on lines 338 are multiplexed by via address registers 339, 340 and the RAS* and CAS* signals to the row decoder 341 and column decoder/data input/output multiplexer 343, respectively. The row decoder 341 places a high signal on the one of the word lines 346 that is addressed. The column decoder/data input output multiplexer 343 either places the data signal on line 335 on the one of the bit lines 347 corresponding to the column address, or outputs on the data line 335 the signal on the one of the bit lines 347 corresponding to the column address, depending on whether the function is a write or read function. As is known in the art, the read function is triggered when the RAS* signal precedes the CAS* signal, and the write function is triggered when the CAS* signal comes before the RAS* signal. The transistors such as 78 and 77 (FIG. 5) in the cells connected to the word line that is high turn on, permitting the data signal on the bit lines 79, 80 to be written into the capacitors 78 and 77 respectively, or the logic state on the capacitors 78, 77 to be read out on the bit lines 79, 80, respectively, as described above, depending on whether the write or read function is implemented. Other logic required or useful to carry out the functions outlined above as well as other known memory functions is also included in the memory 336 but is not shown or discussed as it is not directly applicable to the invention.

The ferroelectric materials, such as 17, utilized in the capacitors according to the invention are preferably layered superlattice materials, such as those described in U.S. patent application Ser. No. 965,190 which is incorporated herein by reference. These materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium. A preferred layered superlattice material is strontium bismuth tantalate ($SrBi_2Ta_2O_9$).

There has been described a simple memory circuit that reads and restores a ferroelectric capacitor in a single operation, and has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it has been disclosed how the use of specific reference voltages or dummy capacitors enable the use of a single latch as a sense amplifier that also restores the ferroelectric capacitor that is read, other methods and apparatus for providing the reference voltage and other latches and read processes that do the same can be substituted. It is also evident that the signals discussed may in some instances occur in a different order. Or equivalent structures and process may be substituted for the various structures and processes described. Or a variety of different circuits and ferroelectric materials may be used. Consequently, the invention is to be construed as embracing each and every novel feature and novel combination of features present in and/or possessed by the nonvolatile memory and read and write processes described.

We claim:

1. A ferroelectric destructive read-out memory of the type having a memory cell capable of taking on a first and second logic state, said memory cell comprising one or more ferroelectric capacitors capable of taking on a first polarization state corresponding to a logic "1" state and a second polarization state corresponding to a logic "0" state, a bit line, and a switch means for permitting charge to be transferred from one of said ferroelectric capacitors to said bit line while destroying the logic state on said one or more ferroelectric capacitors, the polarization state of said one or more ferroelectric capacitors determining the logic state of said memory cell, said memory including read/rewrite circuit means for, in a single electronic operation, both driving said bit line to a logic state determined by the state of said one ferroelectric capacitor prior to said charge transfer and restoring each of said one or more ferroelectric capacitors to the state it was in prior to said charge transfer.

2. A non-volatile memory as in claim 1 wherein said read/rewrite circuit means comprises a sense amplifier connected to said bit line.

3. A non-volatile memory as in claim 2 wherein said read/rewrite circuit further includes a constant voltage source connected to said ferroelectric capacitor.

4. A non-volatile memory as in claim 3 further including a reference voltage line, and wherein said sense amplifier comprises a latch, a first transistor connecting said latch to said reference voltage line, and a second transistor connecting said latch to said bit line.

5. A non-volatile memory of the type having a constant voltage source, a bit line, a memory cell comprising a first ferroelectric capacitor capable of taking on a first polarization state corresponding to a logic "1" state and a second polarization state corresponding to a logic "0" state, and a sense amplifier for sensing and amplifying the signal placed on said bit line by said capacitor when the state of said first ferroelectric capacitor is read, said first ferroelectric capacitor connected between said bit line and said constant voltage source, wherein said memory further comprises a source of a reference voltage, and said sense amplifier comprises a latch connected between said reference voltage and said bit line.

6. A non-volatile memory as in claim 5 and further including a first transistor connecting said latch to said reference voltage, and a second transistor for connecting said latch to said bit line.

7. A non-volatile memory as in claim 6 wherein said source of a reference voltage comprises a second ferroelectric capacitor.

8. A non-volatile memory as in claim 7 wherein said second ferroelectric capacitor has an area that is smaller than the area of said first ferroelectric capacitor but greater than ½ the area of said first ferroelectric capacitor.

9. A non-volatile memory as in claim 6 wherein said source of a reference voltage comprises a linear capacitor.

10. A non-volatile memory as in claim 5 wherein said memory cell is a 1 transistor, 1 capacitor cell.

11. A non-volatile memory as in claim 5 wherein said memory cell is a 2 transistor, 2 capacitor memory cell.

12. A non-volatile memory as in claim 5 wherein said sense amplifier comprises means for forcing said bit line to a first voltage when said first capacitor is in said logic "1" state and for forcing said bit line to a second voltage when said capacitor is in said logic "0" state, and said constant voltage is substantially halfway between said first voltage and said second voltage.

13. A non-volatile memory as in claim 5 wherein said reference voltage is between $Q_l/C_D$ and $Q_{sw}/C_D + Q_l/C_D$, where $Q_l$ is the charge determined by the linear capacitance of said first ferroelectric capacitor, $C_D$ is the capacitance of said bit line, and $Q_{sw}$ is the switching charge of said first ferroelectric capacitor.

14. A non-volatile memory of the type having a constant voltage source, a bit line, a reference voltage line connected to a source of a reference voltage, and a memory cell comprising a first ferroelectric capacitor capable of taking on a first polarization state corresponding to a logic "1" state and a second polarization state corresponding to a logic "0" state, with said first ferroelectric capacitor connected between said bit line and said constant voltage source, said memory including sense amplifier means connected to said bit line and to said reference line for driving said bit line and said reference line to different voltages corresponding to opposite logic states.

15. A non-volatile memory as in claim 14 wherein said constant voltage is substantially halfway between said different voltages corresponding to said opposite logic states.

16. A non-volatile memory as in claim 14 wherein said reference voltage is between $Q_l/C_D$ and $Q_{sw}/C_D + Q_l/C_D$, where $Q_l$ is the charge determined by the linear capacitance of said first ferroelectric capacitor, $C_D$ is the capacitance of said bit line, and $Q_{sw}$ is the switching charge of said first ferroelectric capacitor.

17. A method of reading and restoring the state of a ferroelectric capacitor capable of existing in a logic "1" polarization state and a logic "0" polarization state, said method comprising the steps of:
  providing a latch, a bit line, and a reference voltage circuit that provides a reference voltage between the voltage assumed by said bit line when said ferroelectric capacitor having a logic "0" polarization state is connected to it and the voltage assumed by said bit line when said ferroelectric capacitor having a logic "1" polarization state is connected to it;
  applying a constant voltage to one plate of said ferroelectric capacitor;
  discharging any voltage on said bit line;
  electrically connecting said latch between said bit line and said reference voltage circuit;
  electrically connecting said bit line to said capacitor; and
  turning on said latch.

18. A method as in claim 17 and further comprising the steps of disconnecting said latch from said bit line and said reference voltage circuit and disconnecting said ferroelectric capacitor from said bit line.

19. A non-volatile memory as in claim 17 wherein said reference voltage is between $Q_l/C_D$ and $Q_{sw}/C_D + Q_l/C_D$, where $Q_l$ is the charge determined by the linear capacitance of said ferroelectric capacitor, $C_D$ is the capacitance of said bit line, and $Q_{sw}$ is the switching charge of said ferroelectric capacitor.

* * * * *